United States Patent
Jayaraj et al.

(10) Patent No.: US 10,103,728 B1
(45) Date of Patent: Oct. 16, 2018

(54) ADAPTIVE BODY BIASING IN CMOS CIRCUITS TO EXTEND THE INPUT COMMON MODE OPERATING RANGE

(71) Applicant: Exar Corporation, Fremont, CA (US)

(72) Inventors: Vinit Jayaraj, Santa Clara, CA (US); Pekka Ojala, Fremont, CA (US); John Tabler, Morgan Hill, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 15/474,791

(22) Filed: Mar. 30, 2017

(51) Int. Cl.
    *H03K 3/01*     (2006.01)
    *H03K 17/16*     (2006.01)
    *H03K 17/30*     (2006.01)

(52) U.S. Cl.
    CPC .................................. *H03K 17/302* (2013.01)

(58) Field of Classification Search
    CPC .................................................... H03K 17/302
    See application file for complete search history.

(56) References Cited

U.S. PATENT DOCUMENTS

| | | | |
|---|---|---|---|
| 6,281,735 B1 | 8/2001 | Corsi et al. | |
| 7,728,649 B1 * | 6/2010 | Webb | H03K 17/165 327/404 |
| 2010/0165607 A1 | 7/2010 | Miyatake et al. | |
| 2014/0002144 A1 | 1/2014 | Hatakeyama et al. | |

OTHER PUBLICATIONS

International Search Report and Written Opinion dated Jun. 16, 2017 for PCT/US2017/25128.

\* cited by examiner

*Primary Examiner* — Kevnneth B Wells
(74) *Attorney, Agent, or Firm* — McAndrews, Held & Malloy, Ltd (57) ABSTRACT

In order to get the best of both high and low common mode ranges, an adaptive body biasing method using a pair of replica devices is implemented. Each replica device corresponds to a NMOS (or PMOS) device that constitutes the input pair used in a logic circuit or other type of integrated circuits. This configuration helps to increase the threshold voltage of the device, utilizing body effect, at high input common mode voltage, as desired for NMOS, and at low input common mode voltage, as desired for PMOS. At the same time, this configuration scales the threshold back to normal at low input common mode voltages, thereby countering the negative impact of body effect. In short, the body bias applied to the NMOS (or PMOS) device helps in adapting the threshold voltage to the operating condition.

36 Claims, 7 Drawing Sheets

ADAPTIVE BODY BIASING IN CMOS CIRCUITS TO EXTEND THE INPUT COMMON MODE OPERATING RANGE

BACKGROUND

Technical Field

Described are methods and apparatus for biasing integrated circuit devices to extract desired performance range.

Brief Description of the Prior Art

In a typical Complementary Metal Oxide Semiconductor (CMOS) circuit having an input stage comprising negative-channel MOS (NMOS) devices or positive-channel MOS (PMOS) devices, the maximum or minimum input common mode voltage is determined by the threshold voltage of the NMOS or PMOS.

In the case of an NMOS input pair, to achieve a high common mode input range, the body of the NMOS input pair is typically connected to Ground (GND) or the lowest voltage (Vss) in order to raise the threshold voltage through body effect. The body effect is the change in threshold voltage of a transistor due to the voltage difference between the source and bulk (substrate) of the transistor device. Connecting the body of the input pair NMOS devices to Ground has a negative impact in that the low common mode input range is sacrificed and the NMOS devices will turn off earlier as the input common mode voltage is decreased.

In case of a PMOS input pair, to achieve a low common mode input range, the body of the PMOS input pair is typically connected to Supply or highest voltage (Vcc) in order to raise the threshold voltage through body effect. This has a negative impact in that the high common mode input range is sacrificed and the PMOS devices will turn off earlier as the input common mode voltage is increased.

SUMMARY

A biasing scheme is required in NMOS and PMOS input devices to counter the known problem of early turn-off described above so that devices can be operated in a wider operating range of common mode voltage. Additionally, the biasing scheme should be such that small signal source-body voltage of the NMOS or PMOS devices would not detrimentally affect the input device's gain.

In order to get the best of both high and low common mode ranges, an adaptive body biasing method using a pair of replica devices is implemented. Each replica device corresponds to a NMOS (or PMOS) device that constitutes the input pair used in an integrated circuit, such as a differential pair circuit, operational amplifier, comparator, amplifying gain stages etc. The replica device is chosen so that the intrinsic device parameters and dimensions of the replica device match as closely as possible with the parameters and dimensions of the corresponding NMOS (or PMOS) device. In order to bias the input device's body independently of the source and substrate potentials, the device is built in an isolated well structure of the process. The replica device will also use an isolated well structure to closely match the input device electrical behavior. The body bias applied to the NMOS (or PMOS) device helps in adapting the threshold voltage to the operating condition. Embodiments of this disclosure help to increase the threshold voltage of the device, utilizing body effect, at high input common mode voltage, as desired for NMOS, and at low input common mode voltage, as desired for PMOS. At the same time, the embodiments scale the threshold back to normal at low input common mode voltages, thereby countering the negative impact of body effect.

BRIEF DESCRIPTION OF THE DRAWINGS

These and other aspects and features of the present disclosure will become apparent to those ordinarily skilled in the art upon review of the following description of specific embodiments of the disclosure in conjunction with the accompanying figures, wherein.

DETAILED DESCRIPTION

Embodiments of the present disclosure will now be described in detail with reference to the drawings, which are provided as illustrative examples of the disclosure so as to enable those skilled in the art to practice the disclosure. Notably, the figures and examples below are not meant to limit the scope of the present disclosure to a single embodiment, but other embodiments are possible by way of interchange of some or all of the described or illustrated elements.

Moreover, where certain elements of the present disclosure can be partially or fully implemented using known components, only those portions of such known components that are necessary for an understanding of the present disclosure will be described, and detailed descriptions of other portions of such known components will be omitted so as not to obscure the disclosure.

In the present specification, an embodiment showing a singular component should not be considered limiting; rather, the disclosure is intended to encompass other embodiments including a plurality of the same component or nested stages, and vice-versa, unless explicitly stated otherwise herein. Moreover, applicants do not intend for any term in the specification or claims to be ascribed an uncommon or special meaning unless explicitly set forth as such. Further, the present disclosure encompasses present and future known equivalents to the known components referred to herein by way of illustration.

Figure 1:
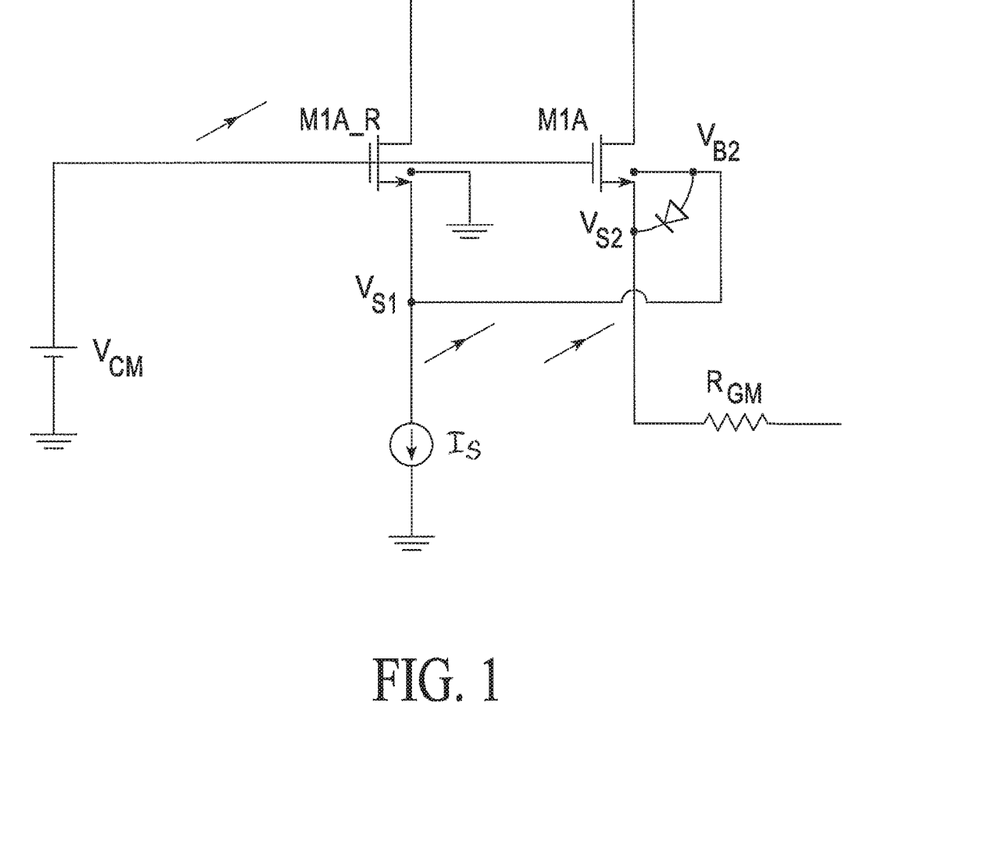
FIG. 1 is a schematic of a circuit demonstrating the large signal advantage of adaptive body biasing, according to an embodiment.

Referring to FIG. 1, a schematic is shown demonstrating the large signal advantage of adaptive body biasing. The schematic in FIG. 1 is shown for an NMOS input pair case, but a similar circuit configuration can be used for a PMOS input pair case as well, though the common mode voltage requirement would be different when PMOS devices are used rather than NMOS devices. FIG. 1 describes the DC operating input common mode voltage (VCM) range for large signal operation, where voltages are described with an upper case 'V.' Also, it is to be noted that only one NMOS device (with its corresponding replica device) of the input pair is shown for simplicity. Persons skilled in the art would understand that another NMOS device (and its corresponding replica device) would complete the input stage. A plurality of devices in parallel, or additional nested devices forming a hierarchy of stages can be used as well.

In FIG. 1, $M_{1A}$ is one of the NMOS devices in the main input pair. $M_{1A\_R}$ is the replica device. Use of this replica device (and body effect on this replica device) is a unique feature of this disclosure. Note that the body of the replica device $M_{1A\_R}$ is tied to ground whereas the body of $M_{1A}$ is driven by the source of $M_{1A\_R}$. The body effect of MOSFET changes the device's threshold voltage $V_{th}$ as the following equations:

$$V_{th} = V_{TO} + \gamma(\sqrt{V_{SB} + 2\Phi_F} - \sqrt{2\Phi_F}) \quad \text{(Eq 1), where}$$

$$\gamma = \sqrt{2\varepsilon_s q N_A}/C_{ox} \quad \text{(Eq 2)}$$

In the first equation above, VTO indicates threshold voltage when $V_{SB}$ is zero, $\gamma$ indicates the body effect coefficient set by material parameters, and $\Phi_F$ is a constant whose value depends on the manufacturing process doping concentration of device bulk region and temperature. In the second equation above, q indicates electric charge, $\varepsilon_s$ indicates dielectric constant of semiconductor, $N_A$ indicates acceptor concentration, and $C_{ox}$ indicates oxide capacitance per unit area. It is to be noted that since $M_{1A\_R}$ is a replica device of $M_{1A}$, the device parameters, such as VTO, $\gamma$ etc. match between $M_{1A\_R}$ and $M_{1A}$. In general, the replica device is chosen so that the intrinsic device parameters and dimensions of the replica device match as closely as possible with the parameters and dimensions of the corresponding main NMOS (or PMOS) device in the circuit. The only parameter that is changing is the source-body voltage $V_{SB}$ of $M_{1A}$ in order to control threshold voltage via change in $V_{SB}$. Therefore, over process and temperature variation, the matching between $M_{1A\_R}$ and $M_{1A}$ remains substantially intact. In general, the replica device is built using commonly used layout matching techniques to replicate the geometry, layer stack, surrounding environment and electrical behavior of the input device as closely as possible when bias-points voltages at terminals match. The replica device is commonly placed in immediate vicinity of the input device in order to reduce the effect of the silicon material parameters variation across space between devices. Both input device and replica device are built in isolated well structures in order to enable bulk region biasing independent of substrate potential.

The gates of $M_{1A\_R}$ and $M_{1A}$ are connected to the same input voltage. In this schematic, the gates are connected to a common mode voltage of $V_{CM}$. $M_{1A\_R}$ is biased as a source follower with a constant current source. $I_S$ is the DC bias current. Body effect on $M_{1A\_R}$ is utilized on purpose to have $V_{S1}$ change non-linearly as $V_{CM}$ changes.

At low $V_{CM}$, source voltage $V_{si}$ of the replica device will be closer to $V_{CM}$. As shown in FIG. 1, body voltage $V_{B2}$ of $M_{1A}$ is tied to the source voltage $V_{si}$ of replica device $M_{1A\_R}$. Threshold voltage increase on $M_{1A}$ is minimized by driving its body voltage $V_{B2}$ closer to its source voltage $V_{S2}$. This means $V_{si}$ is approximately equal to $V_{s2}$. Under this operating condition, $(V_{S2} - V_{B2})$ is small, implying that $V_{CM}$ can go lower and only be limited by the intrinsic threshold voltage $(V_{TH} - V_{ro})$ of $M_{1A}$ and is not altered by the body effect.

Figure 2:
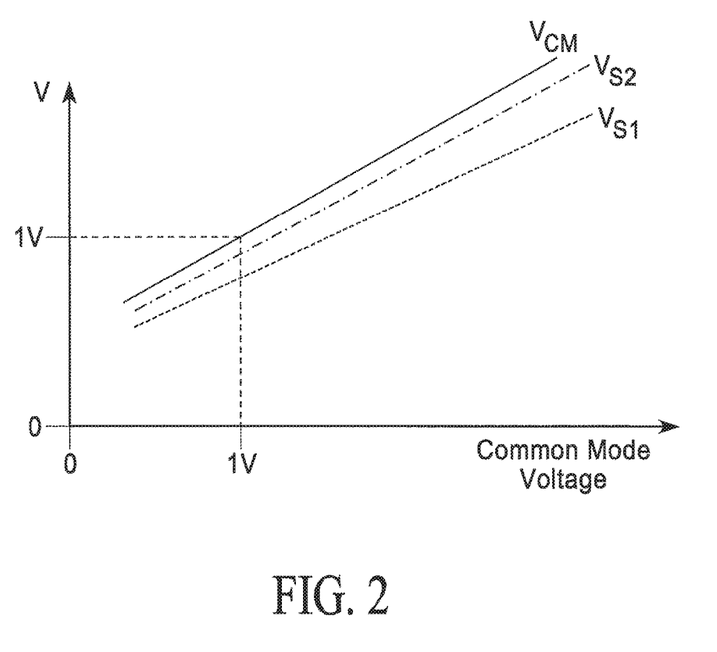
FIG. 2 is a plot showing the DC variation of common mode voltage in the large signal configuration shown in FIG. 1, as well as how $V_{s1}$ and $V_{s2}$ change with respect to the common mode voltage.

FIG. 2 shows the variation of $V_{si}$ and $V_{S2}$ from a low common mode voltage range to a high common mode voltage range, with respect to reference common mode voltage $V_{CM}$. At high $V_{CM}$, $V_{SI}$ diverges from $V_{CM}$ further and $(V_{CM} - V_{si})$ increases due to the body effect, as shown in FIG. 2. Since $V_{si}$ gets relatively lower compared to $V_{CM}$, as $V_{CM}$ increases, $(V_{s2} - V_{B2})$ increases, the body effect on MIA increases and the effective threshold voltage of $M_{1A}$ increases. This increases the high common mode range on $V_{CM}$ and $M_{1A}$ will stay in saturation even at high $V_{CM} - V_{S2}$ largely follows $V_{CM}$ while $V_{si}$ deviates from it.

In short, the advantage of adaptive body biasing for large signal is that, at low $V_{CM}$, threshold increase of $M_{1A}$ is minimized by driving its body to be close to its source, i.e. keeping $(V_{S2} - V_{B2})$ small, thereby improving low $V_{CM}$ range. At high $V_{CM}$, since body of $M_{1A\_R}$ is at GND, $V_{S1}$ diverges from $V_{S2}$, increasing $(V_{S2} - V_{B2})$ and increasing the threshold of M1A, thereby improving high common mode voltage range.

Figure 3:
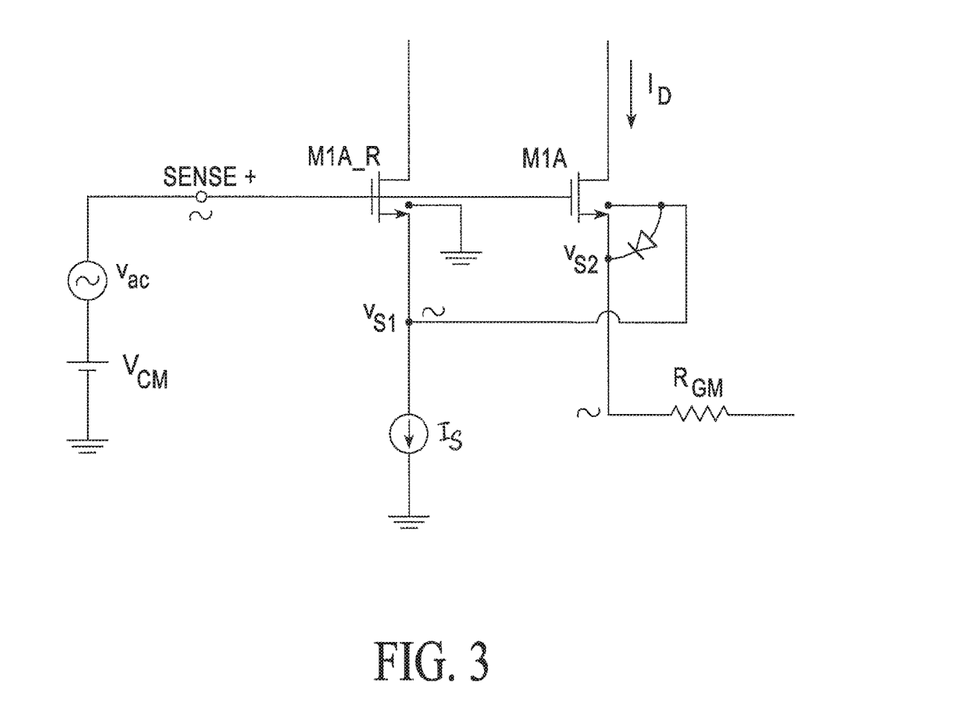
FIG. 3 is a schematic of a circuit demonstrating the small signal advantage of adaptive body biasing, according to an embodiment.
Figure 4:
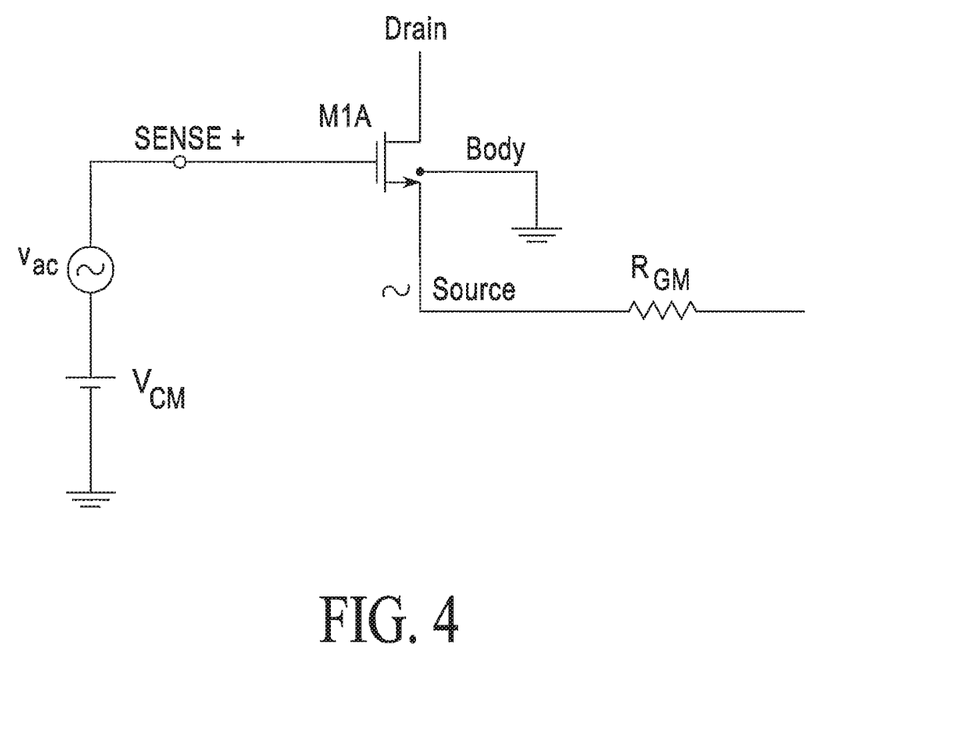
FIG. 4 shows the NMOS source follower small-signal equivalent circuit that can be used to calculate the gain of a stage, according to an embodiment.
Figure 5:
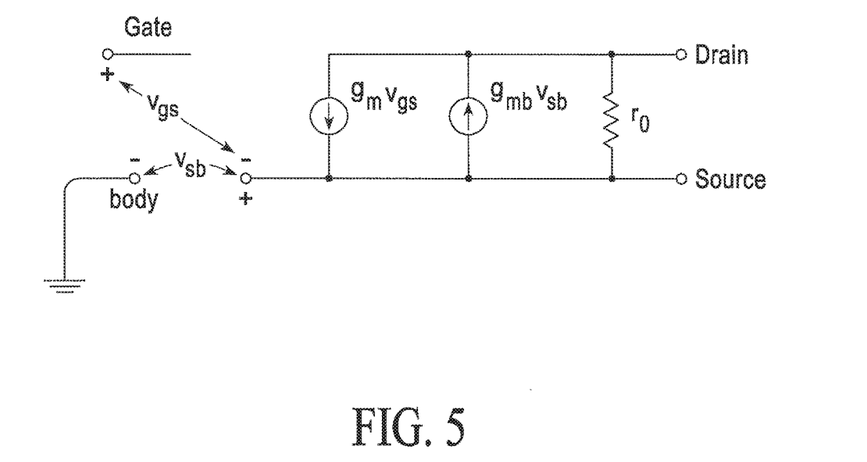
FIG. 5 shows an AC small signal model of the gain stage source follower circuit shown in FIG. 4.

Referring to FIG. 3, a schematic is shown demonstrating the small signal advantage of adaptive body biasing for the same circuit shown in FIG. 1. Specifically, FIG. 3 is shown to analyze the effect of body effect in the ac small signal domain. As described above, the schematic is shown for an NMOS input pair case, but can be applied to a PMOS input pair case as well. The small signal voltages are described with a lower case 'v,' for example, $v_{ac}$. FIG. 4 shows the AC small signal voltages of a gain stage source follower circuit of prior art, i.e. without the replica device. FIG. 5 shows an AC small signal model of the circuit shown in FIG. 4.

In FIG. 3, $V_{CM}$ is the input DC common mode input as described with reference to FIGS. 1 and 2, $v_{ac}$ is the AC small signal applied to the differential input pair. The SENSE+voltage is used to calculate current flowing through $R_{GM}$, as described below with respect to FIG. 6. As SENSE+ voltage moves with $v_{ac}$, source voltage $v_{s1}$ of the replica device $M_{1A\_R}$ moves and source voltage $v_{s2}$ of the input pair NMOS device $M_{1A}$ also moves. Since $v_{s1}$ and $v_{s2}$ move in tandem, the small signal source-body voltage $v_{sb}$ of $M_{1A}$, which is equal to $(v_{s2} - v_{s1})$, is small or negligible. Hence the $(g_{mb} \cdot v_{sb})$ current source (shown in FIG. 5) in the small signal model of $M_{1A}$ disappears or will have negligible effect on the small signal gain perspective. As obvious to persons skilled in the art, $g_{mb}$ is the body transconductance used to model the current source in the small signal model taking body effect into account.

For small signal, the ideal condition is to make $v_{sb}$ of $M_{1A}$ equal to zero. To make body bias $v_{sb}$ of $M_{1A}$ small, [i.e., to meet the condition $v_{sb}(M_{1A}) = (v_{s2} - v_{s1}) \sim$ small], the following condition has to be met:

$$\left(\frac{g_{mb}}{g_m}\right)_{M1A} = \left(\frac{2}{R_{GM}}\right) \cdot \left(\frac{1}{g_m}\right), \text{ where} \quad \text{(Eq. 3)}$$

$$g_m = \sqrt{2 \cdot I_D \cdot \beta \cdot \frac{W}{L}} \quad \text{(Eq 4)}$$

$$g_{mb} = \frac{\gamma \cdot g_m}{2 \cdot \sqrt{-2\phi - V_{BS}}} \quad \text{(Eq. 5)}$$

$$\beta = \mu \cdot C_{ox} \quad \text{(Eq. 6)}$$

Here, transconductances $g_m$ and $g_{mb}$ are respectively the front-gate transconductance and back gate transconductance of $M_{1A}$. $R_{GM}$ is the load. In the equations above, μ indicates mobility, W indicates width of transistor $M_{1A}$, L indicates length of transistor $M_{1A}$, Cox, Φ and γ are already defined above.

When $v_{sb}$ ($M_{1A}$)=($v_{s2}-v_{s1}$) is small, ($g_{mb} \cdot v_{sb}$) current source in the small signal model has almost no effect. This means the applied $v_{ac}$ effectively falls across $R_{GM}$, making the following approximation true, where $G_m$ is the total gain of the stage.

$$G_m \cong \frac{1}{R_{GM}} \quad \text{(Eq. 7)}$$

Figure 6:
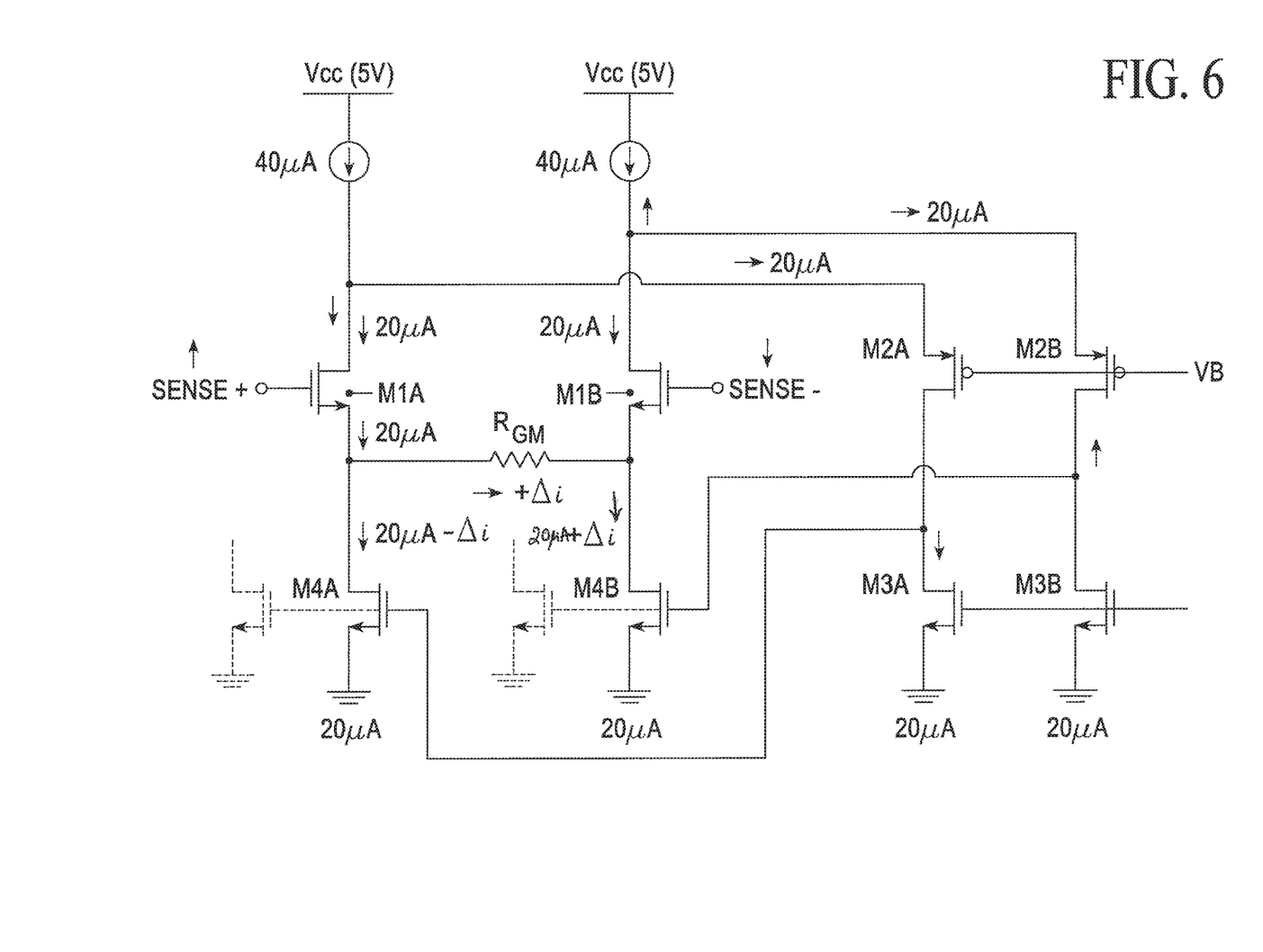
FIG. 6 shows an example circuit topology where the body biasing scheme of the present disclosure can be applied.

FIG. 6 shows an example current sense circuit where the inventive concept can be applied. In FIG. 6 $M_{1A}$ and $M_{1B}$ are the main devices of a differential amplifier. The unconnected stubs for $M_{1A}$ and $M_{1B}$ are the body connections, which can be driven by the replica devices disclosed herein, and shown in FIGS. 1, 3 and 4. In FIGS. 1, 3 and 4, the other half of a differential pair with $M_{1B}$ is not shown for simplicity and clarity, since the circuit is symmetric with respect to $M_{1A}$ and $M_{1B}$.

Persons skilled in the art would appreciate that the disclosure is not limited to the example circuit shown in FIG. 6, which is merely an example of how the bodies of $M_{1A}$ and $M_{1B}$ can be driven by the replica devices. There exist many other circuit topologies where the replica device idea can be used. We can use the example circuit of FIG. 6 to calculate the gain $G_m$ in Equation 7, as shown below:

$$v_{ac} = (\text{SENSE}^+ - \text{SENSE}^-) \quad \text{(Eq 8)}$$

$$\text{Therefore, } \Delta i = \frac{(\text{SENSE}^+ - \text{SENSE}^-)}{R_{GM}} = \frac{V_{ac}}{R_{GM}} \quad \text{(Eq. 9)}$$

$$\text{Hence, total gain of the stage, } G_m = \frac{\Delta i}{V_{ac}} = \frac{1}{R_{GM}} \quad \text{(Eq. 10)}$$

The gain calculation formula of Eq. 10 holds true for the circuits shown in FIGS. 1, 3 and 4, as discussed above and shown in Equation 7, only when the input devices are driven by replica devices. Typically, without the replica devices, as the common mode voltage increases, $M_{1A}$ and $M_{1B}$ experience larger $V_{SB}$ (assuming body=ground in the absence of the replica devices). This increases the threshold voltage, as shown by Eq. 1. Also, as $v_{sb}$ increases, $g_{mb}$ decreases, as shown by Eq. 5. Therefore, without the replica devices, the approximation of Eq. 7 would not hold true because of the effect of the ($g_{mb} \cdot v_{sb}$) current source that comes into play. Replica devices prevent the current source to negatively affect the gain of the input devices. Persons skilled in the art would appreciate that the voltage and current values shown in the circuit of FIG. 6 are merely non-limiting example values, and other values may be used depending on the circuit topology.

Figure 7:
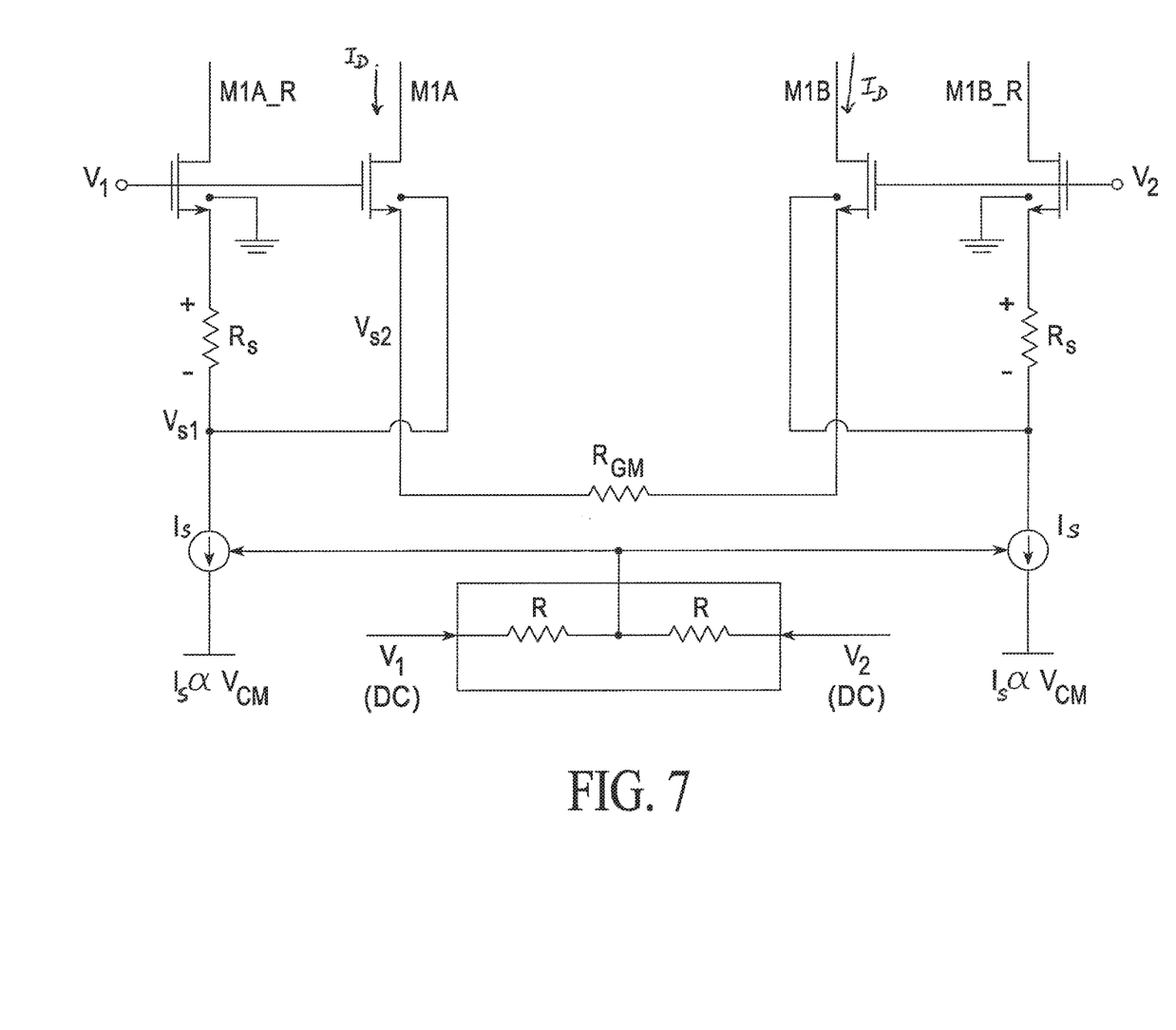
FIG. 7 shows an example circuit where threshold voltage of transistors increases with common mode voltage not just by body effect, but also by a drop across a source resistor.

FIG. 7 shows another example circuit for demonstrating how using source resistors $R_S$ for the replica devices $M_{1A-R}$ (corresponding to the first transistor $M_{1A}$ of the differential pair) and $M_{1B-R}$ (corresponding to the second transistor $M_{1B}$ of the differential pair) helps threshold voltage tuning. The main idea is to increase the value of $I_S$ in the current source as a function of common mode DC input voltage $V_{CM}$. As $V_{CM}$ increases, $I_S$ also increases, so drop across source resistors $R_S$ also increases. Consequently, $V_{S1}$ decreases as a function of $V_{CM}$. Therefore, threshold voltage of $M_{1A}$ increases with $V_{CM}$ not just by body effect of $M_{1A\_R}$ and $M_{1B\_R}$ but also by drop across the source resistors $R_S$. In the above circuit, voltages $V_1$ and $V_2$ are equivalent to the SENSE+ and SENSE− voltages shown in FIG. 6. In an alternative embodiment, one may choose to not use $R_S$, and only use current proportional to $V_{CM}$ to control $V_{GS}$ of $M_{1A\_R}$ and $M_{1B\_R}$ which increases as a function of square root of the current. A resistor divider can be used as the common mode detector with the mid-point of the resistor divider being equal to $V_{CM}$.

Although the present disclosure has been particularly described with reference to the preferred embodiments thereof, it should be readily apparent to those of ordinary skill in the art that changes and modifications in the form and details may be made without departing from the spirit and scope of the disclosure. It is intended that the appended claims encompass such changes and modifications.

The invention claimed is:

1. A method for tuning a threshold voltage of an input device used in an input stage of a Complementary Metal Oxide Semiconductor (CMOS) circuit by biasing a body of the input device, wherein a gate of the input device is connected to an input voltage, the method comprising:
   providing a replica device in between the input voltage and the input device, wherein a body of the replica device is connected to ground, a source of the replica device is connected to the body of the input device, and a gate of the replica device is connected to the input voltage to which the gate of the input device is also connected; and
   driving the body of the input device by the source of the replica device, wherein:
     a nonlinear change in a voltage of the source of the replica device with respect to a common mode voltage is used to tune the threshold voltage of the input device within a range of the common mode voltage;
     the source of the replica device is driven by a current source with a current value proportional to the common mode voltage; and
     a drop across a source resistor of the replica device controls the threshold voltage in conjunction with the body effect of the replica device.

2. The method of claim 1, wherein a voltage difference between the source of the replica device and the source of the input device increases due to the body effect of the replica device, as the common mode voltage increases, resulting in the non-linear voltage change that is used to tune the threshold voltage of the input device.

3. The method of claim 1, wherein the step of driving includes:
   keeping a voltage difference between the source and the body of the input device to a value varying between the threshold voltage and $V_{CC}$, thereby minimizing an increase of the threshold voltage due to body effect of the input device.

4. The method of claim 1, wherein the step of driving includes:
   increasing a voltage difference between the source and the body of the input device to a value varying between a saturation voltage and the threshold voltage, thereby allowing the threshold voltage to increase due to body effect of the input device.

5. The method of claim 1, wherein the input device and the replica device are both negative-channel MOS (NMOS) devices.

6. The method of claim 1, wherein the input device and the replica device are both positive-channel MOS (PMOS) devices.

7. The method of claim 1, wherein the input device is one of a pair of input devices comprising the input stage of the CMOS circuit.

8. The method of claim 1, wherein the replica device comprises a source follower coupled to a constant current source.

9. A CMOS circuit having an input stage, wherein the input stage comprises an input device, and a threshold voltage of the input device is tuned by biasing a body of the input device, and wherein a gate of the input device is connected to an input voltage, the input stage comprising:
   a replica device disposed in between the input voltage and the input device, wherein a body of the replica device is connected to ground, a source of the replica device is connected to the body of the input device, and a gate of the replica device is connected to the input voltage to which the gate of the input device is also connected, wherein:
   the body of the input device is driven by the source of the replica device;
   a non-linear change in a voltage of the source of the replica device with respect to a common mode voltage is used to tune the threshold voltage of the input device within a range of the common mode voltage;
   the input device is one of a pair of input devices comprising the input stage of the CMOS circuit;
   the input stage is one of a plurality of input stages; and
   the plurality of input stages are nested hierarchically.

10. The circuit of claim 9, wherein a voltage difference between the source of the replica device and the source of the input device increases due to body effect of the replica device, as the common mode voltage increases, resulting in the non-linear voltage change that is used to tune the threshold voltage of the input device.

11. The circuit of claim 9, wherein a voltage difference between the source and the body of the input device is configured to minimize an increase of the threshold voltage due to body effect of the input device.

12. The circuit of claim 11, wherein the voltage difference is kept at a value that varies between the threshold voltage and $V_{CC}$.

13. The circuit of claim 9, wherein a voltage difference between the source and the body of the input device is increased at a high end of the common mode voltage range, thereby allowing the threshold voltage to increase due to body effect of the input device.

14. The circuit of claim 13, wherein the voltage difference is kept at a value that varies from the saturation voltage to the threshold voltage.

15. The circuit of claim 9, wherein the input device and the replica device are both negative-channel MOS (NMOS) devices.

16. The circuit of claim 9, wherein the input device and the replica device are both positive-channel MOS (PMOS) devices.

17. The circuit of claim 9, wherein the replica device comprises a source follower coupled to a constant current source.

18. The circuit of claim 9, wherein a gain of the input device is not detrimentally affected by the replica device.

19. The circuit of claim 9, wherein the source of the replica device is driven by a current source with a current value proportional to the common mode voltage.

20. The circuit of claim 19, wherein a drop across a source resistor of the replica device controls the threshold voltage in conjunction with the body effect of the replica device.

21. The circuit of claim 9, wherein intrinsic device parameters of the replica device substantially match with corresponding intrinsic device parameters of the input device.

22. The circuit of claim 21, wherein physical geometry, layer stack, surrounding environment and electrical behavior of the replica device substantially match with corresponding features of the input device.

23. The circuit of claim 9, wherein the replica device is adjacent to the input device in order to minimize the effect of the silicon material parameters variation across space between devices.

24. The circuit of claim 9, wherein both the input device and replica device are built in isolated well structures in order to enable bulk region biasing independent of substrate potential.

25. A CMOS circuit having an input stage, wherein the input stage comprises an input device, and a threshold voltage of the input device is tuned by biasing a body of the input device, and wherein a gate of the input device is connected to an input voltage, the input stage comprising:
   a replica device disposed in between the input voltage and the input device, wherein a body of the replica device is connected to ground, a source of the replica device is connected to the body of the input device, and, a gate of the replica device is connected to the input voltage to which the gate of the input device is also connected; wherein:
   the body of the input device is driven by the source of the replica device, wherein a non-linear change in a voltage of the source of the replica device with respect to a common mode voltage is used to tune the threshold voltage of the input device within a range of the common mode voltage;
   the source of the replica device is driven by a current source with a current value proportional to the common mode voltage; and
   a drop across a source resistor of the replica device controls the threshold voltage in conjunction with the body effect of the replica device.

26. The circuit of claim 25, wherein a voltage difference between the source of the replica device and the source of the input device increases due to body effect of the replica device, as the common mode voltage increases, resulting in the non-linear voltage change that is used to tune the threshold voltage of the input device.

27. The circuit of claim 25, wherein a voltage difference between the source and the body of the input device is configured to minimize an increase of the threshold voltage due to body effect of the input device.

28. The circuit of claim 27, wherein the voltage difference is kept at a value that varies between the threshold voltage and $V_{CC}$.

29. The circuit of claim 25, wherein a voltage difference between the source and the body of the input device is increased at a high end of the common mode voltage range, thereby allowing the threshold voltage to increase due to body effect of the input device.

30. The circuit of claim 29, wherein the voltage difference is kept at a value that varies from the saturation voltage to the threshold voltage.

31. The circuit of claim 25, wherein the input device and the replica device are both negative-channel MOS (NMOS) devices.

32. The circuit of claim 25, wherein the input device and the replica device are both positive-channel MOS (PMOS) devices.

33. The circuit of claim 25, wherein the replica device comprises a source follower coupled to a constant current source.

34. The circuit of claim 25, wherein a gain of the input device is not detrimentally affected by the replica device.

35. The circuit of claim 25, wherein the source of the replica device is driven by a current source with a current value proportional to the common mode voltage.

36. A method for tuning a threshold voltage of an input device used in an input stage of a Complementary Metal Oxide Semiconductor (CMOS) circuit by biasing a body of the input device, wherein a gate of the input device is connected to an input voltage, the method comprising:

providing a replica device in between the input voltage and the input device, wherein a body of the replica device is connected to ground, a source of the replica device is connected to the body of the input device, and, a gate of the replica device is connected to the input voltage to which the gate of the input device is also connected; and driving the body of the input device by the source of the replica device, wherein a nonlinear change in a voltage of the source of the replica device with respect to a common mode voltage is used to tune the threshold voltage of the input device within a range of the common mode voltage, wherein:

the input device is one of a pair of input devices comprising the input stage of the CMOS circuit;

the input stage is one of a plurality of input stages; and the plurality of input stages are nested hierarchically.

* * * * *